United States Patent [19]
Takada et al.

[11] Patent Number: 6,063,996
[45] Date of Patent: *May 16, 2000

[54] SOLAR CELL MODULE AND HYBRID ROOF PANEL USING THE SAME

[75] Inventors: Takeshi Takada, Kyotanabe; Kimitoshi Fukae; Toshihiko Mimura, both of Nara; Masahiro Mori, Kyoto; Satoru Shiomi, Kyotanabe, all of Japan

[73] Assignee: Canon Kabushiki Kaisha, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/890,334

[22] Filed: Jul. 9, 1997

[30] Foreign Application Priority Data

Jul. 17, 1996 [JP] Japan ..................... 8-187199

[51] Int. Cl.[7] ................ H01L 31/048; H01L 31/052; H01L 31/058
[52] U.S. Cl. ................ 136/246; 136/251; 136/244; 136/256; 136/259; 136/291; 136/248; 136/258; 126/621; 126/622; 126/623; 126/628; 126/629; 126/634; 126/652; 257/483; 257/434; 257/51; 257/52; 52/173.3
[58] Field of Search ...................... 136/251, 246, 136/244, 256, 259, 291, 248, 258; 126/621, 622, 623, 628, 629, 634, 652; 257/433, 434, 51, 52; 52/173.3

[56] References Cited

U.S. PATENT DOCUMENTS

| | | | |
|---|---|---|---|
| 4,095,997 | 6/1978 | Griffiths | 136/248 |
| 4,860,509 | 8/1989 | Laaly et al. | 136/251 |
| 5,397,401 | 3/1995 | Toma et al. | 136/259 |
| 5,589,006 | 12/1996 | Itoyama et al. | 136/248 |
| 5,651,837 | 7/1997 | Ohtsuka et al. | 136/251 |

FOREIGN PATENT DOCUMENTS

| | | |
|---|---|---|
| 0 625 802 | 11/1994 | European Pat. Off. . |
| 625802 | 11/1994 | European Pat. Off. . |
| 61-287278 | 12/1986 | Japan . |
| 4-192475 | 7/1992 | Japan . |
| 6-140656 | 5/1994 | Japan . |
| 7-176776 | 7/1995 | Japan . |
| 7-280358 | 10/1995 | Japan . |
| 2881496 B2 | 2/1999 | Japan . |

OTHER PUBLICATIONS

Patent Abstracts of Japan, vol. 018, No. 442 (E–1593), Aug. 17, 1994 (JP 06–140656).

Patent Abstracts of Japan, vol. 011, No. 148 (E–506), May 14, 1987 (JP 61–287278).

Patent Abstracts of Japan, vol. 095, No. 010, Nov. 30, 1995 (JP 07–176776).

*Primary Examiner*—Alan Diamond
*Attorney, Agent, or Firm*—Fitzpatrick, Cella, Harper & Scinto

[57] ABSTRACT

A solar cell module according to the present invention includes at least a base material, a first insulating material formed on the base material, a photovoltaic element set including a plurality of photovoltaic elements formed on the first insulating material, and a second insulating material formed on the photovoltaic element set. The base material has an L or W shape. In one embodiment, the base material has an L section shape, and a bent portion is formed in a portion where no photovoltaic element is arrange. In another embodiment, the photovoltaic element set includes a wiring material for electrically connecting the photovoltaic elements, and a bent portion is formed in a portion where the wiring material is arranged. Power generation and heat collection efficiency are increased, and optical deterioration of a non-single-crystal semiconductor are decreased in the present solar cell modules. By incorporating the present solar cell modules into a heat collecting panel, a hybrid roof panel with effective power generation and heat use is obtained.

13 Claims, 10 Drawing Sheets

SOLAR CELL MODULE AND HYBRID ROOF PANEL USING THE SAME

BACKGROUND OF THE INVENTION

1. Field of the Invention

The present invention relates to a solar cell module using photovoltaic elements and a hybrid roof panel formed by integrating the solar cell module and a heat collecting panel.

2. Related Background Art

Conventionally, a solar heat generating system which receives solar light into an insulated box and makes warm water or warm air by using the heat of the received solar light is known as a method of using solar energy. As this solar heat generating system, a heat collecting panel using a black iron plate which readily absorbs light is put into practical use (Japanese Patent Publication No. 7-280358).

FIGS. 13A and 13B are a perspective view and a sectional view, respectively, of the heat collecting panel. This heat collecting panel has a structure in which the heat of solar radiation received by a heat collecting member 1301 (a black iron plate) is confined in a glass box 1302 so as not to be radiated to the outside air. Air supplied from an air inlet 1303 receives the heat from the heat collecting member 1301 and is gradually heated, and the resultant warm air is extracted from an air outlet 1304.

The non-light-receiving side of the heat collecting member 1301 is used as an air passage 1305 in the heat collecting panel because glass 1306 is arranged on the light-receiving side and a heat insulating material 1307 as a panel bottom plate is arranged on the non-light-receiving side; the non-light-receiving side including this heat insulating material 1307 has a smaller heat loss to the outside air.

Especially in cold districts, people are deeply interested in heat, so solar heat generating systems using heat collecting panels are in widespread use. Since cold districts are positioned in relatively high latitudes, the incident angles of solar light are small in these districts. Therefore, to efficiently collect heat from solar light, the heat collecting member 1301 must have a certain angle. Ideally, solar light (indicated by the alternate long and two dashed line arrows in FIG. 13B) is incident at right angles.

Normally, it is considered best to arrange the heat collecting surface at an angle of latitude +10° to the horizontal.

FIG. 14 is a sectional view showing a W heat collecting panel thus improved. A plurality of W heat collecting panels 1401 are attached to the heat collecting panel. The heat collecting surface of each heat collecting panel 1401 is inclined at an angle θ in the heat collecting panel, so a high heat collecting effect can be obtained even when the altitude of the sun is low. Accordingly, this heat collecting panel is being widely used in cold districts and the like.

The raised angle θ of the W heat collecting panel 1401 can be freely set at an optimum angle in accordance with the incident angle of solar light (indicated by the alternate long and dashed line arrows in FIG. 14) by taking account of the latitude of the place and the roof pitch. Also, since the heat collecting plates 1401 form a continuous W shape, it is possible to give a resistance to the air stream on the non-light-receiving side of the heat collecting plates 1401. This partly improves the heat collection efficiency.

As described above, cold districts in which heat collecting panels are actually used are in many instances high-latitude areas. Therefore, the W heat collecting panel, FIG. 14, which has a high heat collection efficiency is used more often than the heat collecting panel using the flat heat collecting plate as shown in FIGS. 13A and 13B. Additionally, the raised angle θ of the W heat collecting panel can be optimally set in accordance with any existing roof pitch, and the panel can also be attached to, e.g., a wall, rather than a roof. Accordingly, the W heat collecting panel has a high utility value.

In a solar heat generating system, it is necessary to operate a fan to supply warm air obtained by the heat collecting panel as described above into a house, and electricity is required for the purpose. A hybrid roof panel is being developed in which a solar cell element as a power supply of the fan is arranged in the heat collecting panel and which thereby can simultaneously perform heat collection and power generation.

This hybrid roof panel, however, is impractical because an inert gas or the like must be sealed to ensure the weather resistance of the solar cell element with respect to a heat transfer medium, and this increases the number of problems such as the airtightness of the panel. Also, the insulating properties of the solar cell as a power supply must be secured. Therefore, if the solar cell element is directly used, the insulating properties of the heat collecting panel must also be secured.

Furthermore, low workability and high cost are problems in assembling the heat collecting panel. That is, the number of assembly steps is increased to arrange the solar cell element in the heat collecting panel, and attachment parts and their accessory parts are also necessary. Since this increases the assembly cost, the hybrid roof panel is impractical.

SUMMARY OF THE INVENTION

The present invention has been made in consideration of the above situation and has as its object improvement of both the heat collection efficiency and the power generation efficiency of a heat collecting panel (hybrid roof panel) with a solar cell. It is another object of the present invention to provide a hybrid roof panel which can be easily assembled and has a high mass productivity.

To achieve the above objects, a first solar cell module comprises at least a base material, a first insulating material formed on the base material, a photovoltaic element set formed on the first insulating material and including a plurality of photovoltaic elements, and a second insulating material formed on the photovoltaic element set, wherein the base material has an L sectional shape, and a bent portion is formed in a portion where no photovoltaic element is arranged.

A second solar cell module comprises at least a base material, a first insulating material formed on the base material, a photovoltaic element set formed on the first insulating material and including a plurality of photovoltaic elements and a wiring material for electrically connecting the photovoltaic elements, and a second insulating material formed on the photovoltaic element set, wherein the solar cell module has a bent portion in a portion where the wiring material is arranged.

The base material has an L or W shape, and so an optimum raised angle can be freely designed by taking account of the place and the gradient of installation. This increases the amount of power generation. At the same time, this increases the heat collection efficiency and particularly helps recover the optical deterioration of a non-single-crystal semiconductor. By incorporating the solar cell module with this shape into a heat collecting panel, a hybrid roof panel which generates power and simultaneously effectively uses heat is realized.

Especially in the second solar cell module of the present invention in which the base material has a W shape, the solar cell modules need not be connected to each other when the hybrid roof panel is assembled. This further increases the mass productivity of the hybrid roof panel.

In the second solar cell module of the present invention in which a portion where only the wiring material of the photovoltaic element set is formed is bent, this wiring material is a soft metal or a knitted conductor. This improves the yield in the manufacture of the module.

The bending radius of the bent portion is set within a particular range. Consequently, a solar cell module and a hybrid roof panel with an extremely high long-term reliability are provided.

DETAILED DESCRIPTION OF THE PREFERRED EMBODIMENTS

Embodiments of a solar cell module and a hybrid roof panel of the present invention will be described below with reference to the accompanying drawings. However, the present invention is not limited to these embodiments.

Figure 1:
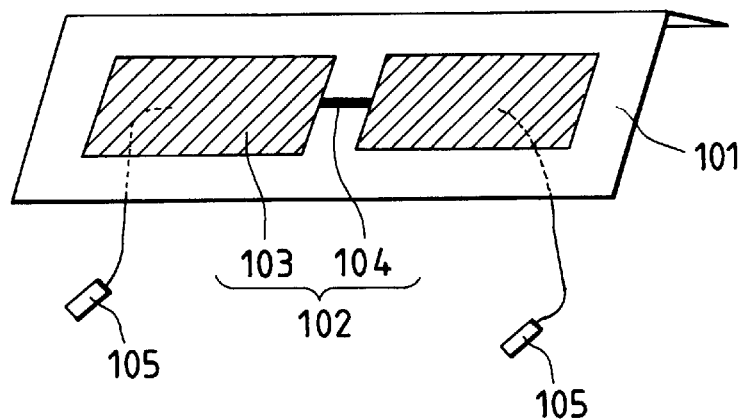
FIG. 1 is a perspective view showing an embodiment of a first W solar cell module of the present invention.
Figure 2:
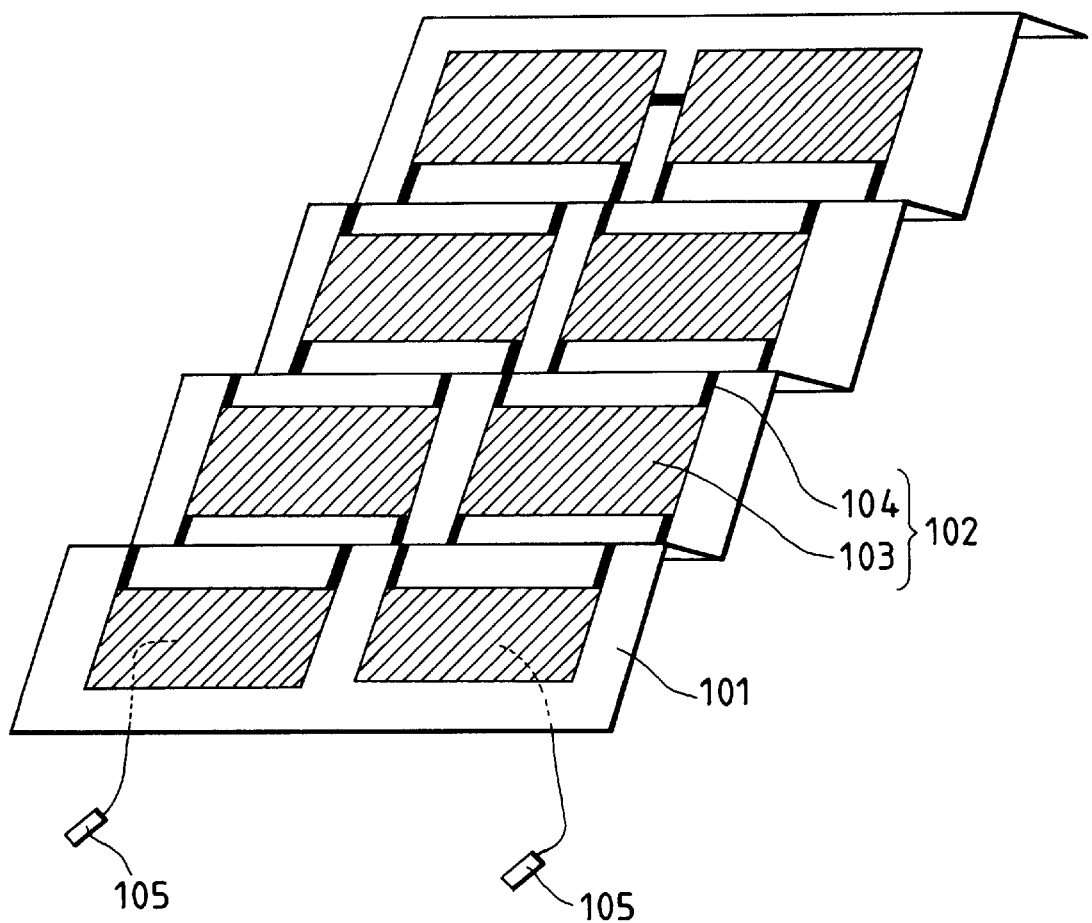
FIG. 2 is a perspective view showing an embodiment of a second W solar cell module of the present invention.

FIGS. 1 and 2 are perspective views of first and second solar cell modules of the present invention. A photovoltaic element set 102 is formed on a base material 101 via a first insulating material (not shown), and a second insulating material (not shown) is formed on the photovoltaic element set 102. Cable connectors 105 are used as terminals. The photovoltaic element set 102 includes a plurality of photovoltaic elements 103 and a wiring material 104 for interconnecting these photovoltaic elements 103.

The first solar cell module of the present invention shown in FIG. 1 is bent in a portion where the photovoltaic element set 102 is not formed. The second solar cell module of the present invention shown in FIG. 2 is bent in portions where the wiring material 104 is formed.

Figure 3:
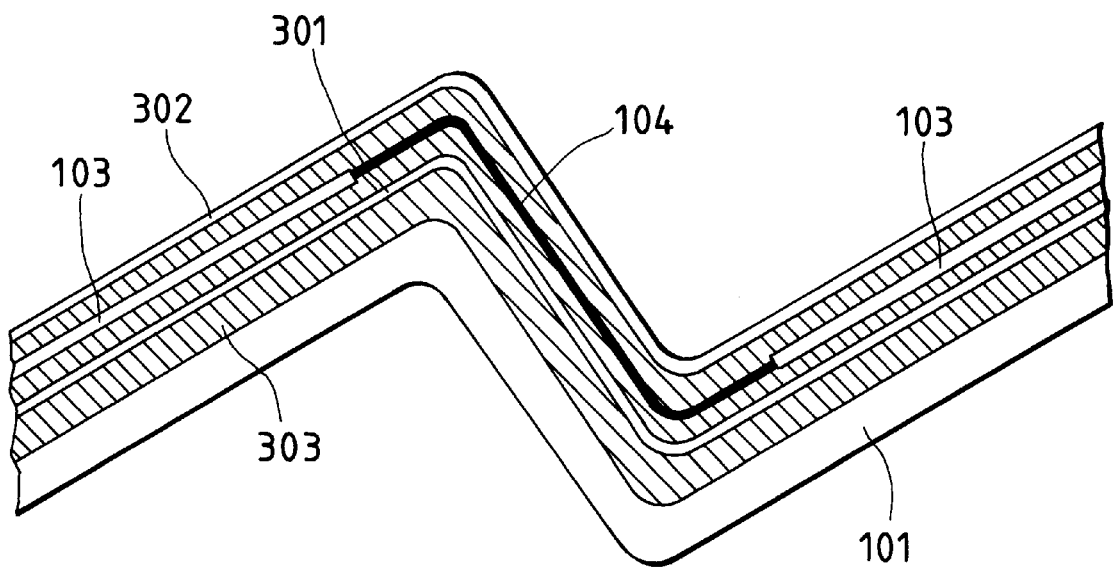
FIG. 3 is a sectional view showing an embodiment of a bent portion of the second W solar cell module of the present invention.

FIG. 3 is a sectional view of the bent portion of the second solar cell module of the present invention. The wiring material 104 is adhered to the base material 101 while being insulated and sealed by a first insulating material 301 and a second insulating material 302. An adhesive 303 is filled in the interfaces between these constituent materials to ensure their adhesion. The individual constituent materials will be described below.

(Base Material 101 )

The base material 101 is a plate material used to increase the strength of the solar cell module and is required to have high weather resistance and high load resistance. The base material 101 must also have high processability so that the material is freely bent into an arbitrary shape. Examples of the material are metal plates such as a copper plate, an aluminum alloy plate, a lead plate, a zinc plate, a titanium plate, and a stainless steel plate, and insulated metal plates such as a coated zinc steel plate.

(First Insulating Material 301 )

The first insulating material 301 must ensure the insulation between the photovoltaic element set 102 and the base material 101 and is required to have excellent insulating properties. The material is preferably superior in elongation, elongation strength, softness, and processability. Examples are nylon and polyethyleneterephthalate.

(Photovoltaic Element Set 102 )

The photovoltaic element set 102 is formed by connecting the photovoltaic elements 103 in series or in parallel by using the wiring material 104.

Figure 4:
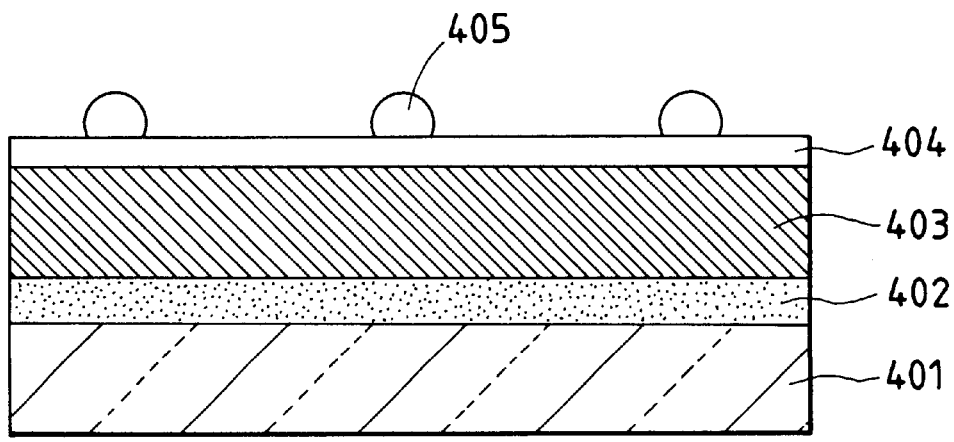
FIG. 4 is a sectional view showing an embodiment of a photovoltaic element according to the present invention.

FIG. 4 is a sectional view of the photovoltaic element 103. The photovoltaic element 103 includes a conductive substrate 401, a backside reflecting layer 402, a semiconductor layer 403, a transparent electrode layer 404, and collector electrodes 405. The conductive substrate 401 is the substrate of a photovoltaic element and serves as an electrode on the non-light-receiving side. The backside reflecting layer 402 reflects light to the semiconductor layer 403 to obtain a higher photovoltaic power. The semiconductor layer 403 absorbs and changes light into electrical energy. The transparent electrode layer 404 is an electrode on the light-receiving side. The collector electrodes 405 are used to efficiently collect currents generated on the transparent electrode.

Examples of the material used as the conductive substrate 401 are stainless steel, aluminum, copper, titanium, a carbon sheet, a galvanized sheet, and a resin film of, e.g., polyimide, polyester, polyethylenenaphthalide, or epoxy, and ceramic such as glass, on which a conductive layer is formed.

As the backside reflecting layer 402, it is possible to use, e.g., a metal layer, a metal oxide layer, and a composite layer of a metal layer and a metal oxide. Examples of the metal are titanium, chromium, molybdenum, tungsten, aluminum, silver, and nickel. Examples of the metal oxide are zinc oxide, titanium oxide, and tin oxide.

Examples of the material forming the semiconductor layer 403 are a non-single-crystal semiconductor, crystalline silicon, and compound semiconductors such as copper, indium, selenide and CdS/CdTe. Examples of a non-singlecrystal semiconductor are amorphous silicon, amorphous silicon germanium, amorphous silicon carbide, amorphous silicon nitride, microcrystals or crystallites of these semiconductors, and polycrystalline silicon. The conversion efficiency of a non-single-crystal semiconductor is lowered by irradiation of light, i.e., a so-called Stebler-Wronski effect is known. However, this optical deterioration is recovered by annealing. Therefore, a non-single-crystal semiconductor is particularly preferably used in the solar cell module of the present invention.

When a non-single-crystal semiconductor is used, the semiconductor layer 403 can be formed by plasma CVD using, e.g., silane gas, germane gas, or a hydrocarbon. When crystalline silicon is used, the semiconductor layer 403 can be formed by sheeting molten silicon and heat-treating a non-single-crystal semiconductor. When a compound semiconductor is used, the semiconductor layer 403 can be formed by electron beam vapor deposition, sputtering, electrodeposition, or printing.

As the construction of the semiconductor layer 403, a pin junction, a pn junction, or a Schottky junction is used.

Examples of the material forming the transparent electrode layer 404 are indium oxide, tin oxide, ITO, zinc oxide, titanium oxide, and cadmium sulfide. As the formation method, it is possible to use, e.g., resistance heating vapor deposition, electron beam vapor deposition, or sputtering.

Examples of the material forming the collector electrodes 405 are metals such as titanium, chromium, molybdenum, tungsten, aluminum, silver, nickel, copper, and tin. As the formation method, it is possible to print a conductive paste in which a powder of any of these metals is dispersed or to bring the conductive paste into contact with a wire of any of these metals. As the binder of this conductive paste, polymers such as polyester, epoxy, phenol, acryl, alkyd, polyvinyl acetate, rubber, and urethane can be used.

The wiring material 104 electrically connects the photovoltaic elements. The material is preferably superior in elongation, elongation strength, softness, and processability, in addition to conductivity. Metals such as aluminum, silver, copper, and tin are examples. It is also possible to use, e.g., a knitted conductor.

The method of connecting the photovoltaic elements 103 and the wiring material 104 is not particularly limited. Examples are soldering, spot welding, and ultrasonic welding.

(Second Insulating Material 302)

The second insulating material 302 protects the surface of the solar cell module and secures its insulation. The second insulating material 302 is required to have excellent insulating properties, high transparency, high weather resistance and to high resistance to contamination. Also, the material is preferably superior in elongation, elongation strength, softness, and processability. Examples are fluorine resin films of polyethylenetetrafluoroethylene, polyethylene trifluoride, and polyvinyl fluoride. Since fluorine resin films do not usually have a high adhesion, it is desirable to perform a corona treatment or a primer treatment on the adhesion surface.

(Adhesive 303)

The adhesive 303 adheres the individual materials described above and is required to have high adhesion, high transparency, and high weather resistance. Additionally, the adhesive 303 must have a flexibility by which the adhesive 303 can follow the expansion and contraction of each material during processing. Examples of the material are resins such as EVA (vinyl acetate-ethylene copolymer), a butyral resin, a silicone resin, and an epoxy resin. Also, to increase the scratch resistance of the solar cell module, it can be impregnated with glass fibers or can contain an ultraviolet absorbent for absorbing ultraviolet radiation which deteriorates the semiconductor layer. If the first and second insulating materials 301 and 302 have adhesion layers, these layers can be used as an adhesive.

(Bending)

The method of bending the solar cell module of the present invention is not particularly limited, and general steel plate processing methods can be used. Examples are bender processing, roll former processing, and pressing. The module is bent by controlling the bending angle and the bending radius by any of these methods. Note that the bending angle is set to an optimum angle in accordance with the installation place and the installation angle.

The bending radius of the bent portion is preferably 3.0 mm or more in the first solar cell module of the present invention and 4.5 mm or more in the second solar cell module of the present invention. If the bending radius of the bent portion is too small, the base material and the insulating materials may peel or the wiring material may crack in the bent portion.

(First Embodiment of Hybrid Roof Panel)

Figure 5:
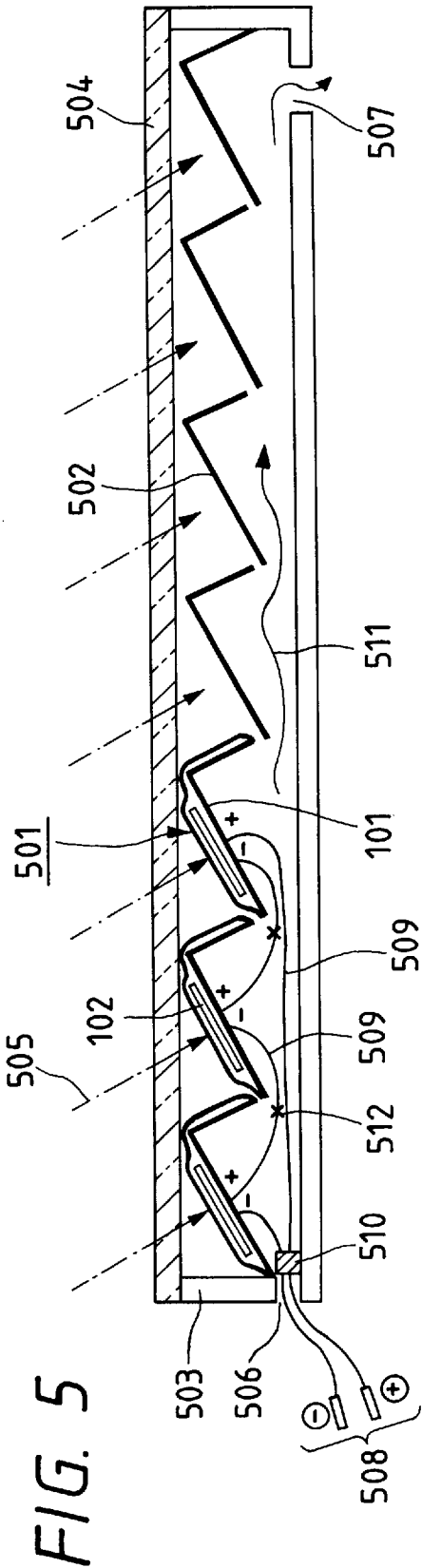
FIG. 5 is a sectional view showing an embodiment of a hybrid roof panel using the first solar cell module of the present invention.

FIG. 5 shows an embodiment of a hybrid roof panel of the present invention which can simultaneously perform heat collection and power generation. In this hybrid roof panel, three first solar cell modules 501 of the present invention as shown in FIG. 1 and four W black iron plates 502 are arranged in a panel casing 503. One surface of the panel casing 503 is a window 504 through which solar light 505 can be received. This hybrid roof panel also has a function as a roofing material and therefore can be arranged on a roof furring or roof structural material such as beams.

The hybrid roof panel of the present invention can take an arbitrary size. For example, the hybrid roof panel can be an integrated panel from the eaves to the ridge, or a plurality of panels can be connected. Alternatively, the hybrid roof panel can be mixed in common roof panels. If this is the case, a ventilation layer is formed between the common roof panels or roofing materials and the roof furring so that the ventilation layer communicates with the casing of the hybrid roof panel of the present invention.

The solar cell module 501 is formed by integrally encapsulating a plurality of photovoltaic elements 102 with first and second insulating materials such as a resin on a base material 101. Also, the solar cell module 501 is bent in a portion where no photovoltaic elements 102 are formed, i.e., a portion including the base material 101 and the insulating materials, and thereby has an L sectional shape.

The panel casing 503 has an air inlet 506 and an air outlet 507 through which air can flow. The solar cell modules 501 and the W black iron plates 502 are so attached as to be exposed to the solar light 505 and divide the air into two portions in the panel casing 503. The solar cell modules 501 and the W black iron plates 502 absorb the solar light, generate heat, and transfer the heat to air 511 on the non-light-receiving side. Air flowing from the air inlet 506 is warmed by the solar cell modules 501 and the W black iron plates 502, and the resultant warm air flows out from the air outlet 507. Air on the light-receiving side is not used as a heat transfer medium because the temperature cannot be sufficiently raised on this side due to the radiation of heat from the window 504.

The outside air is supplied from the air inlet 506, and the hot air extracted from the air outlet is introduced to the inside of a house and can be used in heating the house in the cold weather. A heat storage means and/or an air circulating means can also be installed in the house. In the hot weather, the heat insulating effect of the roof can be enhanced by exhausting the air from the air outlet to the outside of the house. In this manner an air flowing apparatus which keeps the indoor environment comfortable can be constructed.

Also, the solar cell modules 501 naturally generate power, which is extracted from the non-light-receiving side of the modules to the outside by cable connectors 508. The extracted power can be converted into AC power by a power converter or charged into a charging battery.

The number of solar cell modules 501 with the L sectional shape can be appropriately set in accordance with the necessary amount of power. Likewise, the heat collecting effect of the W black iron plates 502 can be enhanced by using selective absorption plates where necessary.

Like the W black iron plate 502, the first solar cell module 501 of the present invention can be readily arranged such that the solar light 505 irradiates the solar cell module 501 at an optimum angle. Therefore, when the hybrid roof panel of the present invention is used, both the heat collection efficiency and the power generation efficiency can be improved.

As the semiconductor layer 403 described previously, a non-single-crystal semiconductor which has excellent characteristics at high temperatures and can be expected to recover optical deterioration at high temperatures is preferably used. However, in cases where the photovoltaic elements are exposed to high temperatures at which the performance of the elements is adversely affected, it is preferable to arrange the solar cell modules 501 in a portion at a relatively low temperature in the panel casing 503. Generally, the temperature in the panel casing 503 is lowest near the air inlet 506 and gradually rises toward the air outlet 507. Therefore, the solar cell modules 501 are arranged near the air inlet 506, and the lead wires 508 for extracting electricity are extended to the outside from the air inlet 506.

When the solar cell modules are used in the casing of the hybrid roof panel of the present invention, caution should be exercised with respect to the temperature of the modules. This is because it is experimentally confirmed that when the hybrid roof panel is used on a roof, for example, the internal temperature rises to about 120° C. To warrant the safety of the solar cell modules in this high-temperature environment, the solar cell modules and the cable connectors of the modules arranged in the panel casing are required to have a heat resistance of 120° C. or more.

The upper-limit value of the continuous use temperature of ETFE (ethylene-tetrafluoroethylene copolymer) or PET (polyethyleneterephthalate) used as the insulating material of the solar cell module is 120° C. or more. Therefore, the safety of, e.g., insulation can be ensured.

The weather resistance of the cable connectors 508, however, is not so taken into consideration as the solar cell modules because the cable connectors 508 are arranged on the backside of a roof. For example, vinyl chloride is generally used as the sheath and/or the housing of the cable. Additionally, the insulating properties of the cable are secured by its housing. When vinyl chloride is used as an insulating material, the upper-limit value of the continuous use temperature of the material is anticipated to be 75° C. That is, the upper-limit temperature of a common heat-resistant cable connector is 75° C.

For this reason, when a plurality of stages of the first solar cell modules 501 of the present invention are to be arranged in the panel casing 503 as shown in FIG. 5, no conventional cable connectors such as vinyl chloride can be used in electrical connections between these solar cell modules 501. Therefore, a connecting portion 512 is formed by the steps of (1) stripping the coverings of heat-resistant wires 509 to be connected to expose their cores, (2) caulking the exposed cores by a solderless sleeve, and (3) moving a heat-shrinkable tubing, in which the wire is previously passed, onto the sleeve and thermally shrinking the tubing by a heat gun to obtain an insulating coating.

On the other hand, the hybrid roof panels are electrically connected outside the panels, so conventional cable connectors can be used for this purpose.

Heat-resistant wires 509 inside the panel and the cable connectors 508 outside the panel are connected on a terminal table in a terminal box 510 arranged near the air inlet 506 of the panel.

(Panel casing 503)

The material of the panel casing 503 preferably has good heat insulating properties, and examples are wood, polystyrene, calcium silicate, and foamed styrol.

(Window 504)

The material of the window 504 preferably has a high light transmittance and good heat insulating properties. Examples are glass, polycarbonate, polyethyleneterephthalate, acryl, and nylon. Also, the window can be attached to the panel casing 503 by using an adhesive such as rubber, silicone, or acryl, and an etch cover can be formed.

(Air inlet 506 and air outlet 507)

Each of the air inlet 506 and the air outlet 507 is formed in at least one portion of the panel casing 503 and allows a heat transfer medium such as air or water to flow in or out. It is also possible to attach a filter for preventing the mixing of dust and the like or a chemical filter against air containing acidic substances. A throttle mechanism can also be provided so as to control the flow rate of air.

(Second Embodiment of Hybrid Roof Panel)

In the first embodiment in which a plurality of module stages are arranged as shown in FIG. 5, it is necessary to electrically connect these modules in assembling the hybrid roof panel, and this complicates the assembly work.

Accordingly, when a plurality of stages of the first solar cell modules of the present invention are necessary, it is more preferable to use the second solar cell module of the present invention as described below instead of the first solar cell modules.

Figure 6:
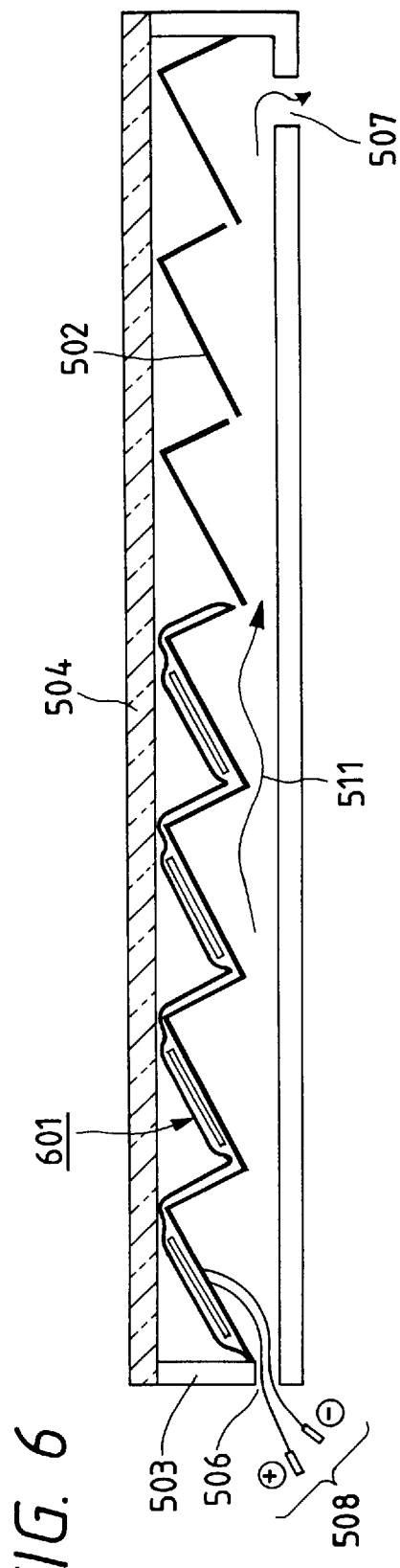
FIG. 6 is a sectional view showing an embodiment of a hybrid roof panel using the second solar cell module of the present invention.

In FIG. 6, the same reference numerals as in FIG. 5 denote the same parts. A solar cell module 601 is the second solar cell module of the present invention as shown in FIGS. 2 and 3. This solar cell module is manufactured by bending a base material 101 in portions of connecting members 104 connecting photovoltaic elements 103.

This embodiment obviates the need for connecting the modules in the hybrid roof panel and thereby simplifies greatly the assembly of the panel and improves the reliability of electrical connection. For these purposes, the bending radius is preferably larger than a certain radius as described earlier.

EXAMPLES

Examples of the present invention will be described below, but the present invention is not limited to these examples.

Example 1

A solar cell module according to this Example is the second solar cell module of the present invention as shown in FIGS. 2 and 3, which is obtained by bending a solar cell module in which non-crystalline photovoltaic elements are insulated and coated with plastic on a galvanized sheet. This solar cell module is formed by integrating five W modules so that the raised angle of the light-receiving surface to the horizontal is about 10°. The solar cell module of this example will be described in detail below with reference to the accompanying drawings.

(Manufacture of Photovoltaic Element)

Figure 7:
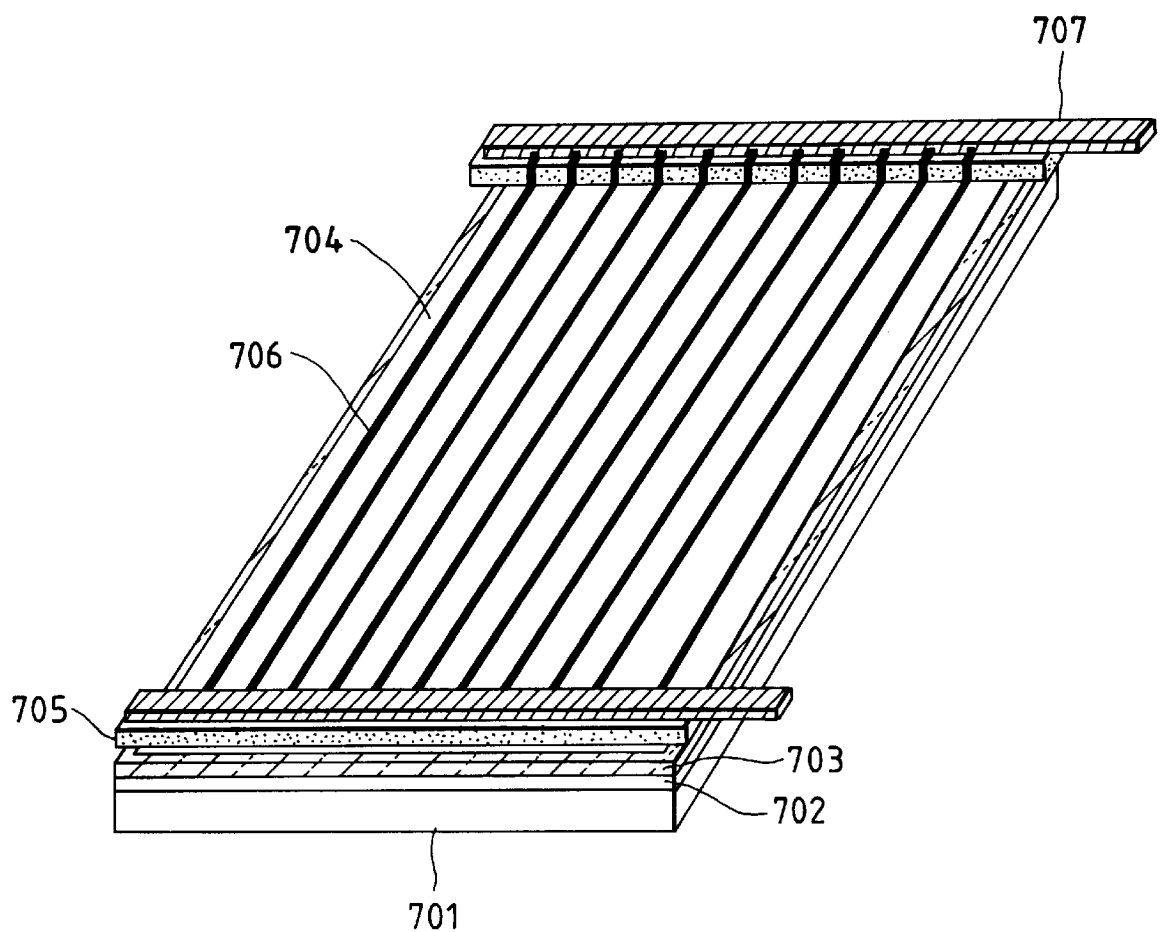
FIG. 7 is a perspective view of a photovoltaic element according to Examples 1 to 4.

First, a photovoltaic element as shown in FIG. 7 was manufactured. An Al layer and a ZnO layer were sequentially formed as a backside reflecting layer 702 on a cleaned stainless steel substrate 701 by sputtering. Subsequently, plasma CVD was performed to form an n-type a-Si layer from a gaseous mixture of $SiH_4$, $PH_3$, and $H_2$, an i-type a-Si layer from a gaseous mixture of $SiH_4$ and $H_2$, and a p-type microcrystal μc-Si layer from a gaseous mixture of $SiH_4$, $BF_3$, and $H_2$, thereby forming a triple a-Si semiconductor layer 703 including n-layer/i-layer/p-layer/n-layer/i-layer/p-layer/n-layer/i-layer/p-layer. Additionally, a thin $In_2O_3$ film was vapor-deposited as a transparent electrode layer 704 by using a resistance heating method.

In the end portions of the stainless steel plate 701, the stainless steel plate 701 and the transparent electrode layer 704 were short-circuited. To repair this short circuit, therefore, the transparent electrode layer 704 was partially removed by electrolytic etching. Thereafter, an insulating double-coated tape 705 was adhered to portions near the two opposing sides of the substrate 701. Carbon paste-coated copper wires 100 μm in diameter serving as collector electrodes 706 were arranged on the upper surface and held by the tape adhesive material. Copper foils as lead electrodes 707 were adhered to sandwich the wires between the foils and the tapes. The whole substrate was then thermally pressed to adhere the carbon paste-coated wires as the collector electrodes 706 to the transparent electrode layer 704.

(Series Connection)

Figure 8:
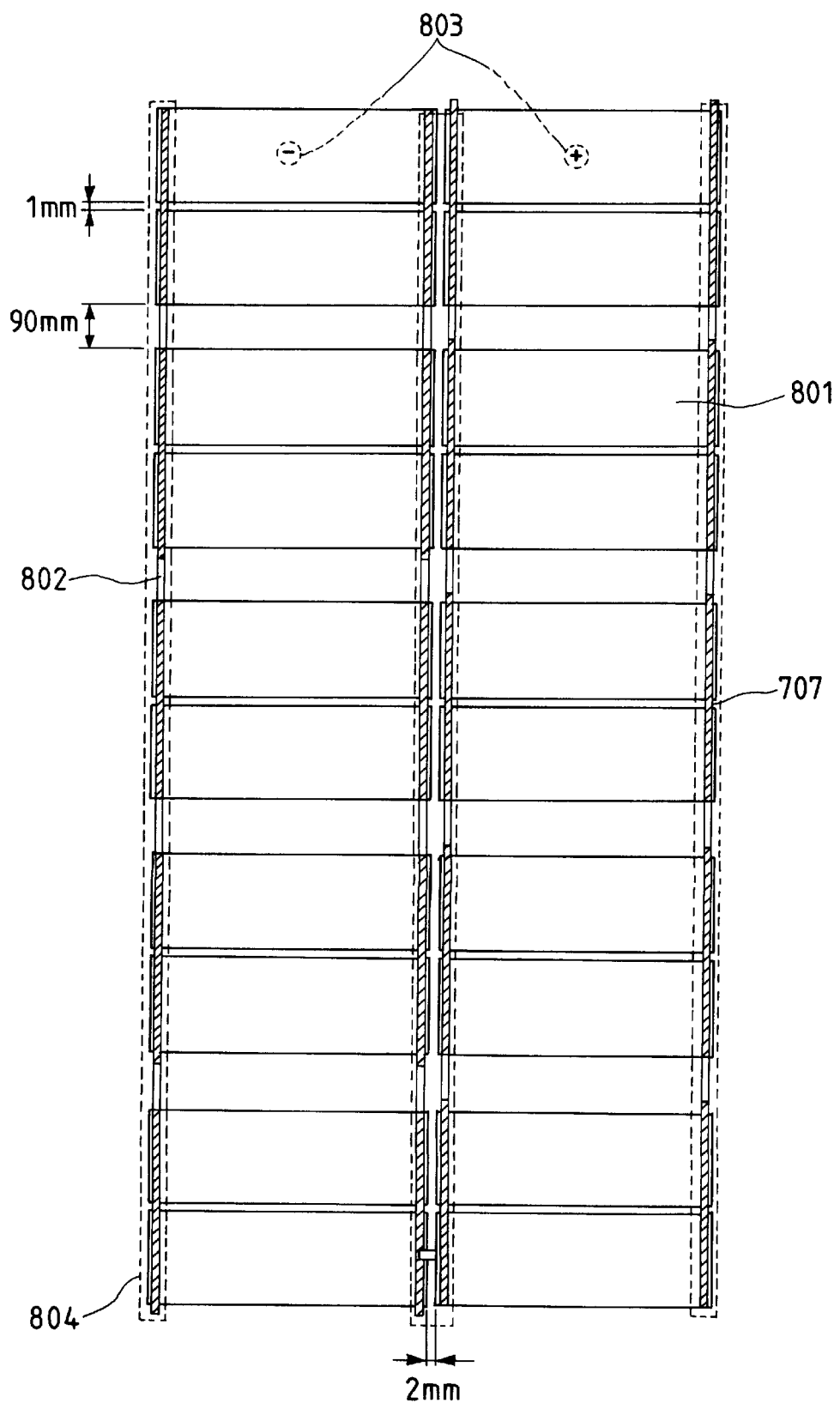
FIG. 8 is a top view of a photovoltaic element set according to Examples 1 and 4.

Subsequently, a photovoltaic element set as shown in FIG. 8 was manufactured. In this photovoltaic element set, twenty photovoltaic elements described above were connected in series. That is, ten photovoltaic elements 801 were arranged by alternately repeating gaps of 1 mm and 90 mm, and another ten photovoltaic elements 801 were similarly arranged to return in the opposite direction with a 2-mm gap between the first and second ten photovoltaic elements. The photovoltaic elements 801 with the 1-mm gap between them were electrically connected by the lead electrodes 707 (FIG. 7). The photovoltaic elements 801 with the 90-mm gap between them were electrically connected by connecting a wiring material 802 to the lead electrodes 707 of these photovoltaic elements 801, because the lead electrodes 707 alone were short. Since the wiring material 802 was to be bent, 200 μm thick soft copper was used. The photovoltaic elements 801 with the 2-mm gap between them were electrically connected by connecting soft copper as the wiring material 802 since the lead electrodes 707 of the photovoltaic elements 801 were not in the direction for that purpose. Positive and negative terminal extracting portions 803 were formed on the lower surfaces of the photovoltaic elements in the end portion. Also, a black PET tape 804 was adhered to the lead electrodes and the wiring material not contributing to power generation to obtain good appearance.

(Manufacture of Module)

Figure 9:
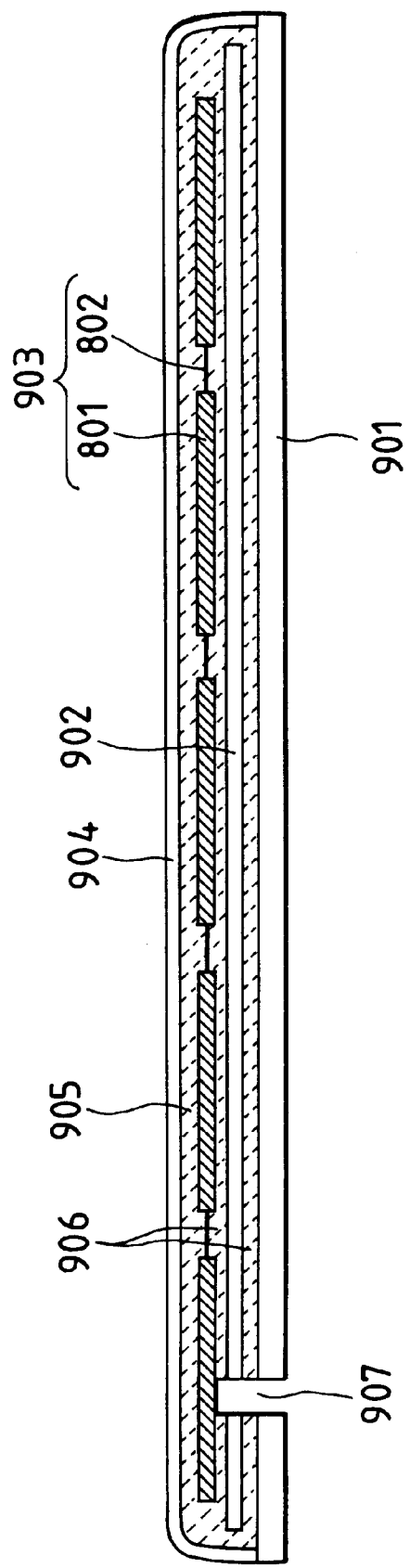
FIG. 9 is a sectional view of a solar cell module before being bent according to Examples 1 and 4.

A solar cell module was manufactured by using the above photovoltaic element set. FIG. 9 is a sectional view of a solar cell module before being bent. A 50-μm thick PET film as a first insulating material 902 was stacked on a 0.4-mm thick galvanized sheet as a base material 901, and a photovoltaic element set 903 including the photovoltaic elements 801, the wiring material 802, and the like was stacked on the first insulating material 902. Additionally, 50-μm thick ETFE (ethylene-tetrafluoroethylene copolymer) as a second insulating material 904 was stacked on the photovoltaic element set 903. The second insulating material 904 and the photovoltaic element set 903 were adhered by 460-μm thick EVA (ethylene-vinyl acetate copolymer) as an adhesive 905. The photovoltaic element set 903 and the first insulating material 902 were adhered by 230-μm thick EVA (ethylene-vinyl acetate copolymer) as an adhesive 906. The first insulating material 902 and the base material 901 were also adhered by another adhesive 906. These materials were adhered by using vacuum lamination. Terminal extraction holes 907 were previously formed in the lower surface of the module.

Figure 10:
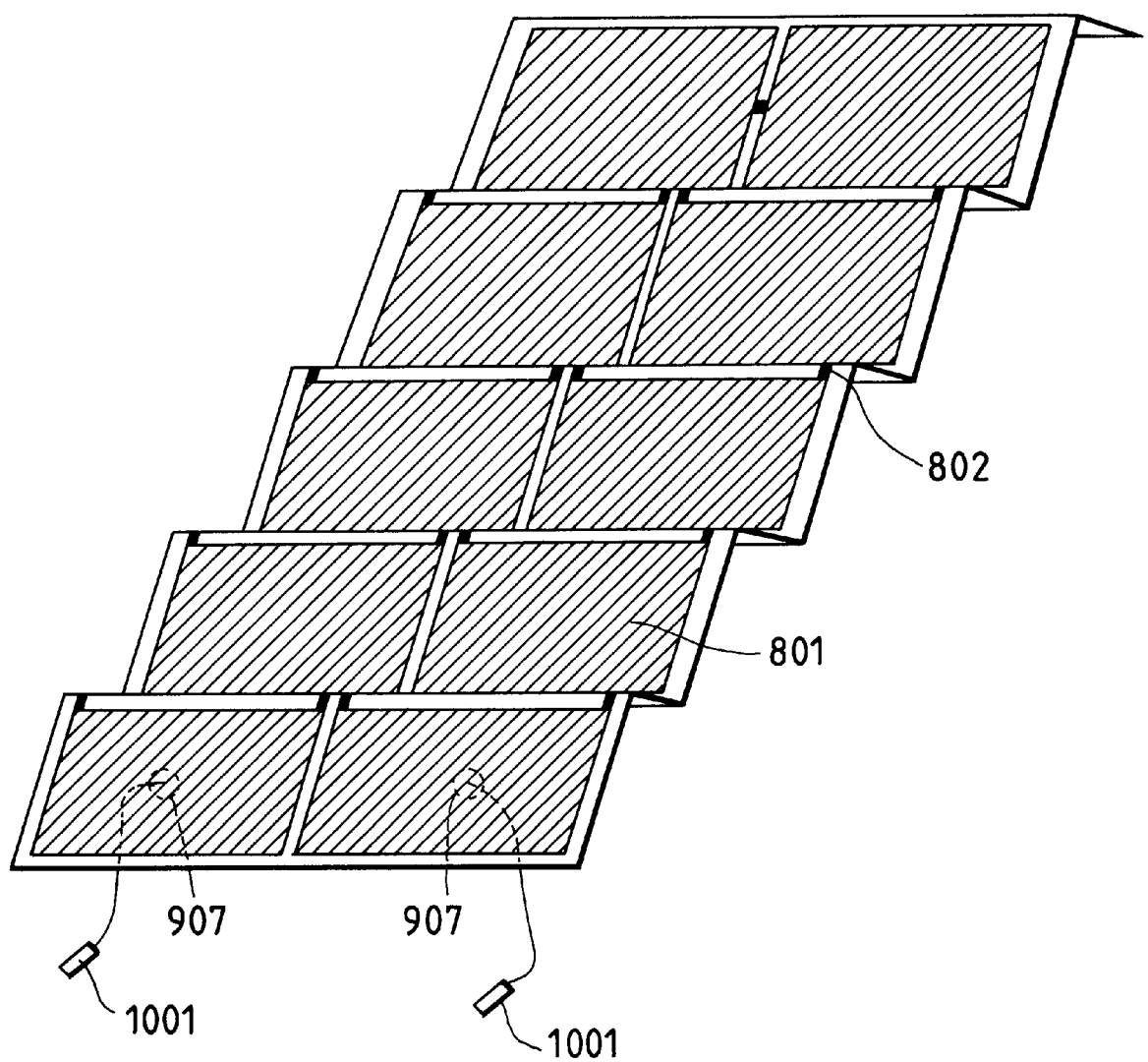
FIG. 10 is a perspective view of a W solar cell module according to Examples 1 and 4.

(Bending) FIG. 10 is a perspective view of a solar cell module after being bent. As shown in FIG. 10, a W shape with a raised angle of 10° was formed by repeatedly bending the module upward and downward 90° at 40 mm intervals in portions where the wiring material 802 was formed. This bending was done using a bender, and the bending radius in the bent portion was set to 4.5 mm. Also, terminals were extracted from the terminal extraction holes 907 by using cable connectors 1001.

Figure 11:
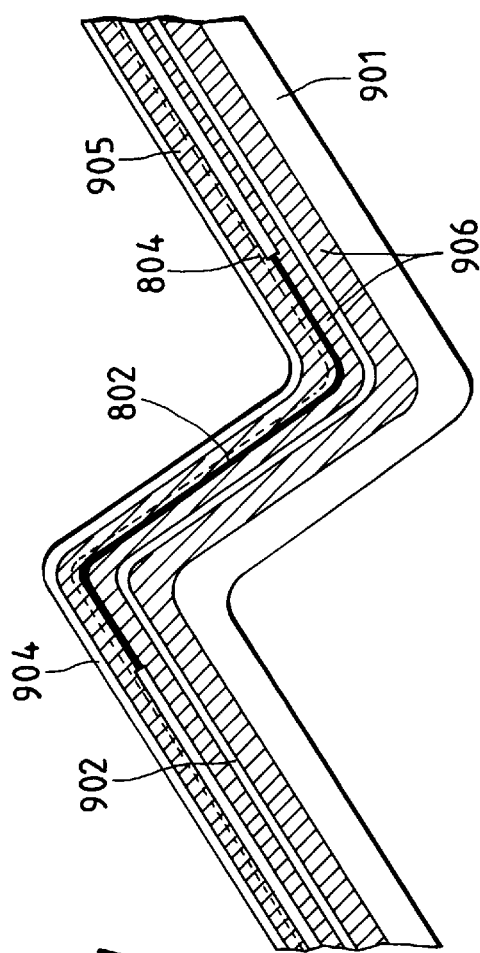
FIG. 11 is a sectional view of a bend portion of the W solar cell module according to Examples 1 and 4.

FIG. 11 is a sectional view of the bent portion. 200-μm thick soft copper as the wiring material 802 was insulated and sealed by 50-μm thick ETFE (ethylene-tetrafluoroethylene copolymer) as the second insulating material 904 and 50-μm thick PET (polyethyleneterephthalate) as the first insulating material 902, and the resultant structure was adhered to a galvanized sheet as the base material 901. A 50-μm thick black PET (polyethyleneterephthalate) tape was adhered as the mask seal 804 (FIG. 8) to the surface of the wiring material 802.

230-μm thick EVA (ethylene-vinyl acetate copolymer) was used as the adhesive 906 in the interface between the wiring material 802 and the first insulating material 902 and the interface between the first insulating material 902 and the base material 901. The force of adhesive to the wiring material (copper) was about 400 g/10 mm.

460-μm thick EVA (ethylene-vinyl acetate copolymer) was used as the adhesive 905 in the interface between the wiring material 802 and the mask seal 804 and the interface between the mask seal 804 and the second insulating material 904.

The neutral plane of bending is the center of the base material 901. When bending is performed, an expanding force acts on the outside, and a contracting force acts on the inside.

Soft copper was used as the wiring material 802 in the bent portion. This is so because if hard copper is used, a tensile force acts on the wiring material to break the wiring material when it is bent. That is, the use of soft copper as the wiring material 802 accomplishes the bending. More specifically, in this example the bending radius of the bent portion was 4.5 mm, and the distance from the neutral plane was about 0.6 mm. Accordingly, the calculated deformation caused by downward bending is an expansion of about 13%. Therefore, soft copper having an elongation of 35% or more is used as the wiring material.

Table 1 shows the results of observation of the states of the wiring material and the module protective materials (the insulating material and the adhesive) when bending was performed by changing the bending radius of the bent portion. As shown in Table 1, when the bending radius was decreased to 1.5 mm, the soft copper wiring material partially cracked. Also, when environmental tests were conducted, the adhesive and other module protective materials peeled especially in upward bent portions. When the bending radius was 3.0 mm, the wiring material did not crack, but the adhesive and the like as the module protective materials peeled in upward bent portions.

These results demonstrate that in the second solar cell module of the present invention in this Example in which bending is performed both upward and downward, bending can be performed in extremely good conditions free of peeling of the adhesive and the like when the bending radius is 4.5 mm or more. On the other hand, in the case of the first solar cell module of the present invention which is bent only downward as shown in FIG. 1, bending can be performed in similarly good conditions when the bending radius is 3.0 mm or more.

The solar cell module of this Example in which the bending radius of the bent portion is 4.5 mm can secure its reliability for long time periods even when exposed to a severe environment, i.e., the outside of a house.

TABLE 1

| Bending radius | 1.5 mm | 3.0 mm | 4.5 mm |
| --- | --- | --- | --- |
| Upward | | | |
| Wiring material | o | o | o |
| Protective materials | x Partially peeled in environmental tests | x Partially peeled in environmental tests | o |
| Downward | | | |
| Wiring material | o Partially cracked | o | o |
| Protective materials | x Partially peeled in environmental tests | o | o |

Note that the environmental tests conducted in this Example included 10 cycles of a humidity cycle test (−40° C.⇆+85° C., 85% RH), 1000 hours of a high-temperature, high-humidity test (85° C., 85% RH), 1000 hours of a 120° C. heat test, and 200 cycles of a temperature cycle test (−40° C.⇆+90° C.).

Example 2

A solar cell module according to this Example has a structure as shown in FIG. 1, i.e., is an L solar cell module obtained by bending a solar cell module manufactured by insulating and coating non-crystalline photovoltaic elements with plastic on a galvanized sheet as in Example 1. The raised angle to the horizontal of the right-receiving surface of this W solar cell module was about 10°.

The W solar cell module of this example was bent in a portion including a base material and a resin, not on a wiring material as in Example 1. The bending radius of the bent portion was 3.0 mm. Like the solar cell module of Example 1, the solar cell module of this Example can also ensure its reliability for long time periods.

Example 3

A solar cell module according to this Example is a W solar cell module obtained by bending a solar cell module manufactured by insulating and coating non-crystalline photovoltaic elements with a resin on a galvanized sheet as in Example 1. This W solar cell module included seven continuous W portions, and the raised angle to the horizontal of the right-receiving surface of this W solar cell module was about 10°.

The differences from the W solar cell module of Example 1 are that the number of bent portions is 7 and a knitted conductor is used as a wiring material in the bent portion. In this example, a tin-plated copper wire was used as a core of the knitted conductor. This improved the shrink properties and the ability to follow deformation during processing. This solar cell module also has an effect of preventing the fatigue breaking of the wiring material in the bent portion when the module is vibrated after bending.

Example 4

A hybrid roof panel according to this Example uses the W solar cell module of Example 1.

Figure 12:
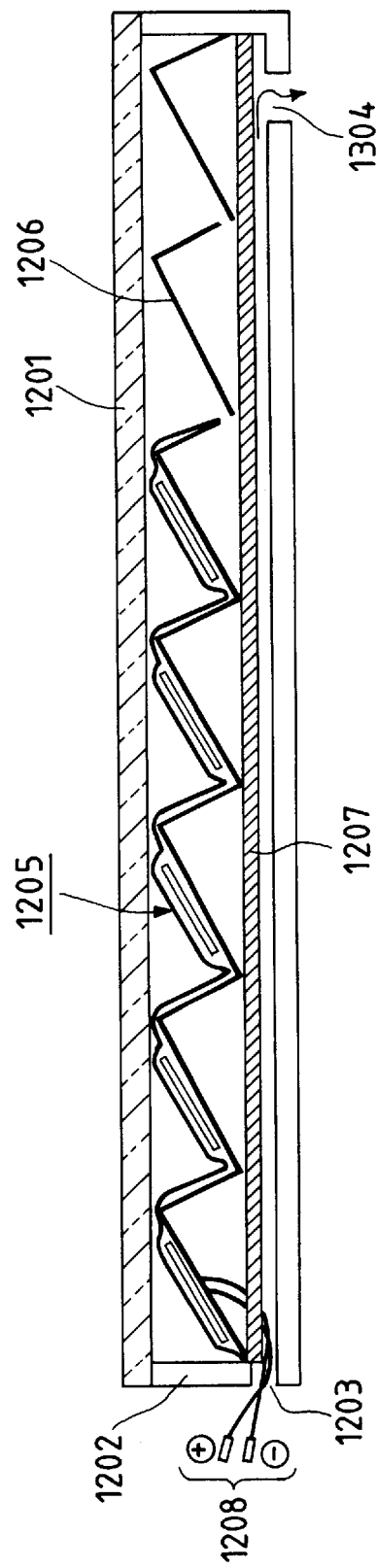
FIG. 12 is a sectional view of a hybrid roof panel according to Example 4.
Figure 13A:
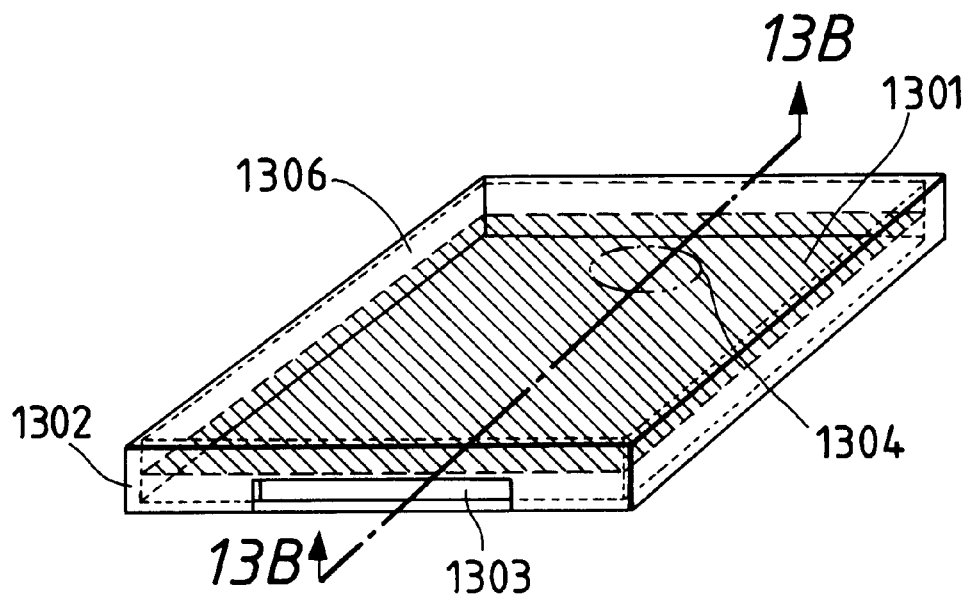
FIG. 13A is a perspective view showing a conventional heat collecting panel.
Figure 13B:
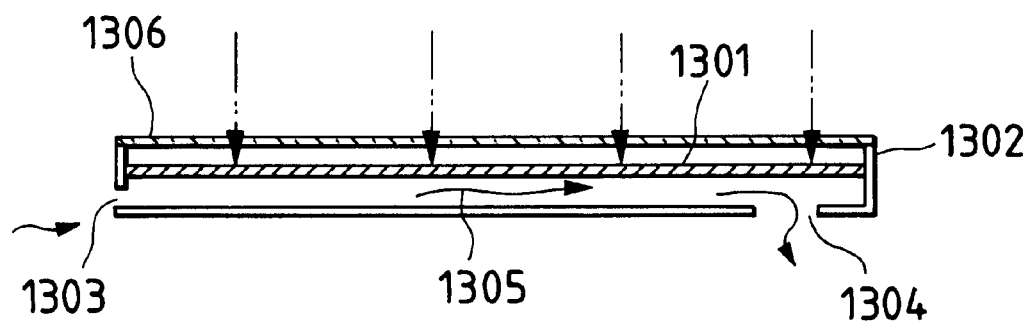
FIG. 13B is a sectional view taken along a line 13B—13B in FIG. 13A.
Figure 14:
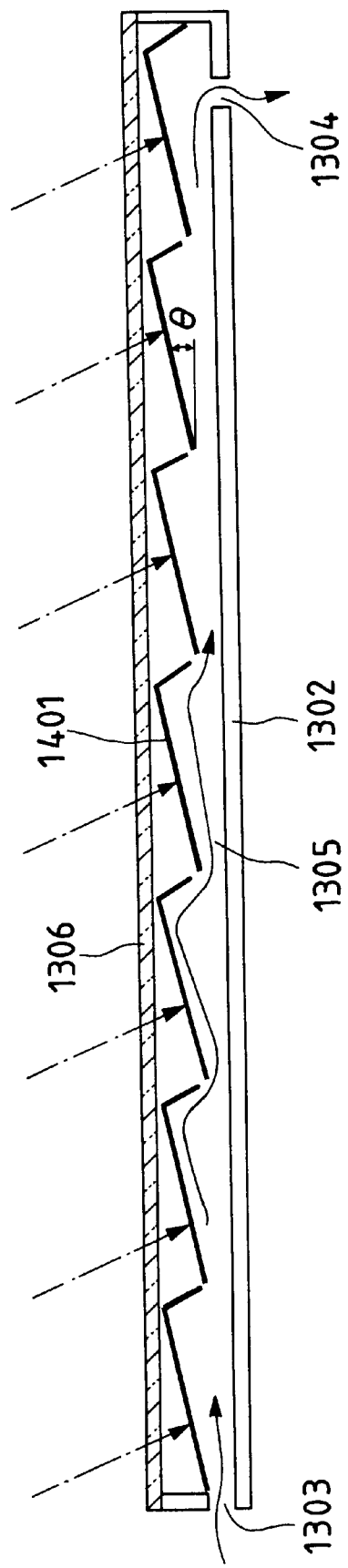
FIG. 14 is a sectional view of a conventional W heat collecting panel.

The structure will be described with reference to the sectional view in FIG. 12. This hybrid roof panel comprises a panel casing 1202 in which an air inlet 1203 and an air outlet 1204 are formed, a window 1201 which transmits light, a W solar cell module 1205 described above, and W black iron plates 1206.

The frames and surfaces of the panel casing 1202 were formed by iron plates to increase the strength of the panel casing 1202. Additionally, the interior of the panel casing 1202 was coated with a heat insulating material (not shown) so as not to release heat. Polystyrene was used as this heat insulating material. 4-mm thick reinforced glass was used as the window 1201 to increase the load resistance and the heat insulating properties, thereby minimizing the heat loss to the outside air. To obtain solar light as much as possible, the window 1201 was formed on almost the entire upper surface of the panel casing.

The air inlet 1203 was formed in one side surface in the widthwise direction of the panel casing 1202. The air inlet 1203 was so formed as to be able to communicate with the space on the non-light-receiving side of the W solar cell module 1205 and the W black iron plates 1206.

The air outlet 1204 was formed, apart from the air inlet 1203, in the lower surface of the panel casing 1202. The air outlet 1204 was a circular hole 150 mm in diameter. This dimension need only be one with which the air outlet 1204 communicates with a duct for supplying warm air into the inside of a house, so the dimension can be selected in accordance with the size of the duct. A dust filter was also provided to prevent the entrance of dust into the house.

In the panel casing 1202, the W solar cell module 1205 and the W black iron plates 1206 were arranged parallel to the window 1201. These W solar cell module 1205 and W black iron plates 1206 were fixed by machine screws to L angles 1207, with some spacers interposed between them, which were attached to the side walls of the panel casing 1202.

The electricity generated by the W solar cell module 1205 was extracted from the air inlet 1203 to the outside by cable connectors 1208. The cable connectors 1208 were positioned near the air inlet 1203. Since, therefore, it was considered that the temperature was the same as that of the rear surface of a common roof, ordinary cable connectors were used.

What is claimed is:

1. A roof panel comprising at least:
    a casing having an air inlet and an air outlet;

a solar cell module so arranged as to divide the interior of said casing into two portions; and a window formed on the upper surface of said casing;

wherein said solar cell module comprises at least a base material, a first insulating material formed on said base material, a photovoltaic element set including a plurality of photovoltaic elements and a wiring material for electrically connecting said photovoltaic elements formed on said first insulating material, and a second insulating material formed on said photovoltaic element set;

wherein said solar cell module has a bent portion in a portion where said wiring material is arranged; and wherein light-receiving surfaces of said photovoltaic elements are at an angle to the bottom of said casing and are parallel to each other.

2. A panel according to claim 1, wherein said wiring material is a soft metal.

3. A panel according to claim 1, wherein said wiring material is a knitted conductor.

4. A panel according to claim 1, wherein the bending radius of the bent portion is not less than 4.5 mm.

5. A panel according to claim 1, wherein each of said photovoltaic elements has a non-single-crystal semiconductor.

6. A roof panel according to claim 1, wherein the angle of the light-receiving surfaces of said photovoltaic elements to the bottom of said casing is about +10 degrees.

7. A roof panel according to claim 1, wherein said solar cell module has conventional cable connectors to extract power.

8. A roof panel according to claim 1, wherein said solar cell module is positioned near the air inlet.

9. A panel according to claim 1, wherein a portion of a section of said base material has a W shape.

10. A method of installing a roof panel which comprises at least a casing having an air inlet and an air outlet, a solar cell module so arranged as to divide the interior of said casing into two portions, and a window formed on the upper surface of said casing, wherein said solar cell module comprises a base material, a first insulating material formed on said base material, a photovoltaic element set including a plurality of photovoltaic elements and a wiring material for electrically connecting said photovoltaic elements formed on said first insulating material, and a second insulating material formed on said photovoltaic element set, wherein said solar cell module has a bent portion in a portion where said wiring material is arranged; and wherein light-receiving surfaces of said photovoltaic elements are at an angle to the bottom of said casing and are parallel to each other, comprising the step of:

arranging said roof panel on a roof furring or a roof structural material to introduce the outside air from said air inlet and to introduce air extracted from said air outlet to the inside of a house or exhaust the air to the outside.

11. A method of installing a roof panel according to claim 10, wherein the angle of the light-receiving surfaces of said photovoltaic elements to the bottom of said casing is about +10 degrees.

12. An air flowing apparatus comprising:

a roof panel comprising at least a casing having an air inlet and an air outlet, a solar cell module so arranged as to divide the interior of said casing into two portions, and a window formed on the upper surface of said casing;

means for introducing the outside air to said air inlet; and means for introducing air extracted from said air outlet to the inside of a house or exhausting the air to the outside, wherein said solar cell module comprises at least a base material, a first insulating material formed on said base material, a photovoltaic element set formed on said first insulating material and including a plurality of photovoltaic elements and a wiring material for electrically connecting said photovoltaic elements, and a second insulating material formed on said photovoltaic element set, wherein said solar cell module has a bent portion in a portion where said wiring material is arranged, and wherein light-receiving surfaces of said photovoltaic elements are at an angle to the bottom of said casing and are parallel to each other.

13. A solar power generator comprising:

a casing having an air inlet and an air outlet;

a solar cell module so arranged as to divide the interior of said casing into two portions; and a window formed on the upper surface of said casing;

wherein the solar cell module comprises at least a base material, a first insulating material formed on said base material, a photovoltaic element set including a plurality of photovoltaic elements and a wiring material for electrically connecting said photovoltaic elements formed on said first insulating material, and a second insulating material formed on said photovoltaic element set, wherein said solar cell module has a bent portion where said wiring material is arranged, and wherein light-receiving surfaces of sai photovoltaic elements are at an angle to the bottom of said casing and are parallel to each other; and a power converter electrically connected to said solar cell module.

* * * * *

UNITED STATES PATENT AND TRADEMARK OFFICE
CERTIFICATE OF CORRECTION

PATENT NO. : 6,063,996
DATED : May 16, 2000
INVENTOR(S) : Takeshi Takada et al.

It is certified that error appears in the above-identified patent and that said Letters Patent is hereby corrected as shown below:

<u>Title page,</u>
Item [56], References Cited, under FOREIGN PATENT DOCUMENTS,
"625802 11/1994 European Pat. Off. ." should be deleted (repetition).
Item [57], ABSTRACT
Line 9, "arrange." should read -- arranged. --.

<u>Column 5,</u>
Line 52, "and to" should read -- and --.

<u>Column 9,</u>
Line 20, "In$_2$0$_3$" should read -- In$_2$O$_3$ --.

<u>Column 10,</u>
Line 18, "FIG. 10" should read -- ¶ FIG. 10 --.

<u>Column 11,</u>
Table 1, "○          ○          " should read -- x          ○          ○ --.
          partially cracked                     partially cracked <u>Column 12,</u>
Line 31, "4-mm thick" should read -- ¶ 4-mm thick --.

Signed and Sealed this

Thirtieth Day of July, 2002

Attest:

JAMES E. ROGAN
Attesting Officer     Director of the United States Patent and Trademark Office